(12) United States Patent
Shimoe et al.

(10) Patent No.: US 6,734,541 B2
(45) Date of Patent: May 11, 2004

(54) SEMICONDUCTOR LAMINATED MODULE

(75) Inventors: Hiroshi Shimoe, Fukuyama (JP);
Naohisa Okumura, Yokkaichi (JP);
Takashi Imoto, Yokohama (JP); Ryuji Hosokawa, Zama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/173,004

(22) Filed: Jun. 18, 2002

(65) Prior Publication Data
US 2002/0190368 A1 Dec. 19, 2002

(30) Foreign Application Priority Data
Jun. 19, 2001 (JP) ......................... 2001-184783

(51) Int. Cl.[7] ........................ H01L 23/02; H01L 29/40
(52) U.S. Cl. ............... 257/686; 257/685; 257/723; 257/777; 257/778; 257/700; 257/779; 257/758
(58) Field of Search ..................... 257/686, 685, 257/777, 723, 737, 738, 778, 787, 668, 700, 701, 774, 758, 692

(56) References Cited

U.S. PATENT DOCUMENTS

| 5,838,061 | A | | 11/1998 | Kim |
| 5,969,426 | A | * | 10/1999 | Baba et al. |
| 6,184,577 | B1 | * | 2/2001 | Takemura et al. |
| 6,448,665 | B1 | * | 9/2002 | Nakazawa et al. |
| 6,455,924 | B1 | * | 9/2002 | Alcoe et al. |

FOREIGN PATENT DOCUMENTS

| JP | 2000-124363 | 4/2000 |
| JP | 2000-252392 | 9/2000 |

* cited by examiner

Primary Examiner—Wael Fahmy
Assistant Examiner—DiLinh Nguyen
(74) Attorney, Agent, or Firm—Finnegan, Henderson, Farabow, Garrett & Dunner, L.L.P.

(57) ABSTRACT

A semiconductor laminated module comprises a plurality of unit packages in which semiconductor chips are bonded to base substrates with a first adhesive, a second adhesive to form a laminated body by bonding the plurality of unit packages to each other, a third adhesive formed to cover an upper surface of the semiconductor chips and having substantially the same thermal expansion coefficient as that of the first adhesive, and an uppermost substrate bonded to uppermost one of the unit packages with the second adhesive.

8 Claims, 2 Drawing Sheets

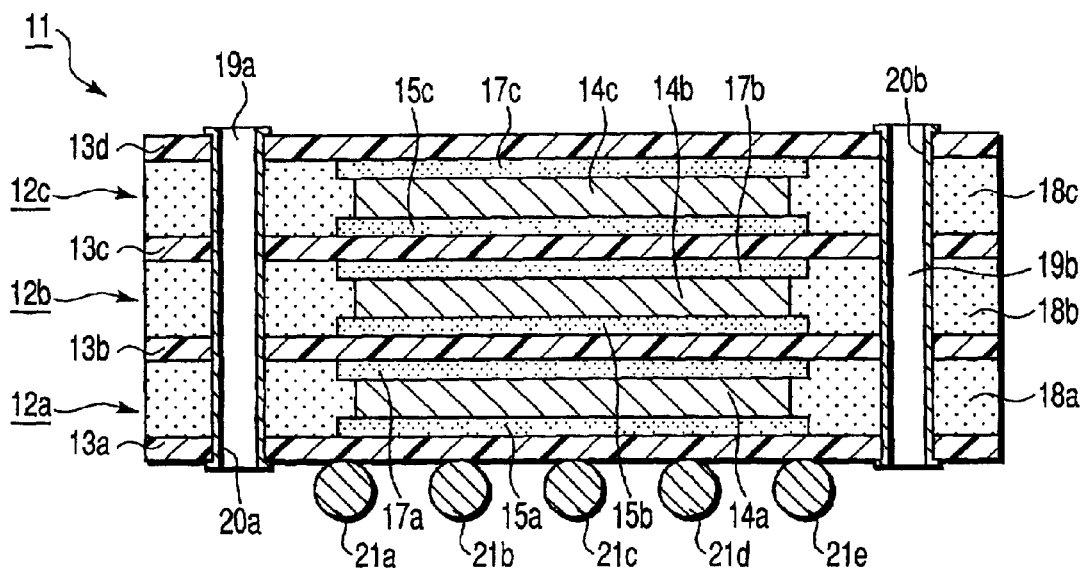
F I G. 1
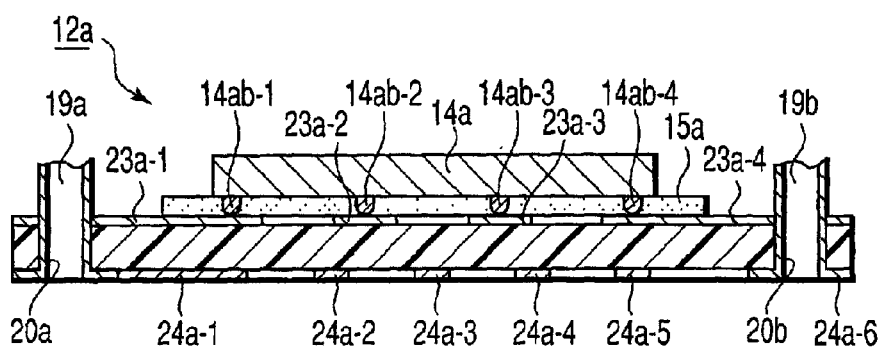
F I G. 2

SEMICONDUCTOR LAMINATED MODULE

CROSS-REFERENCE TO RELATED APPLICATIONS

This application is based upon and claims the benefit of priority from the prior Japanese Patent Application No. 2001-184783, filed Jun. 19, 2001, the entire contents of which are incorporated herein by reference.

BACKGROUND OF THE INVENTION

1. Field of the Invention

The present invention relates to a semiconductor laminated module, for example, comprising a plurality of laminated unit packages loaded with thin film semiconductor chips that are flip-chip connected with base substrates.

2. Description of the Related Art

An example of a constitution of a semiconductor laminated module according to the prior art will be described with reference to FIG. 4. FIG. 4 shows a sectional view of the prior art module. The semiconductor laminated module 41 is constituted by sequentially laminating, for example, three unit packages 42a, 42b and 42c. For example, a semiconductor chip 44a having a thickness of, for example, about 100 μm is flip-chip connected to an upper surface of a base substrate 43a made of a glass-epoxy resin, and is bonded with a chip adhesive 45a such as a film-like thermosetting resin adhesive comprising, for example, an epoxy-based resin, whereby the unit package 42a as the lowermost layer is constituted. The semiconductor chip 44a is integrally bonded onto the base substrate 43a with a substrate adhesive 46a to complete the unit package 42a. A plurality of solder balls 47 are provided on a lower surface of the base substrate 43a, and they constitute connecting terminals to be connected with external devices.

On the lowermost unit package 42a, the unit package 42b as a second layer is laminated, and the unit package 42c as a third layer is further laminated. An upper surface of the unit package 42c of the third layer is covered with a base substrate 43d, thereby forming a laminated body of the semiconductor laminated module 41.

During the unit packages 42a, 42b and 42c are laminated sequentially, they are pressured together and heated, thus sequentially bonded using substrate adhesives 46a, 46b and 46c such as a Prepreg composed of a thermosetting resin adhesive such as an epoxy-based resin. Thus, a three-layer laminated body is formed as shown in FIG. 4.

The base substrate 43d provided on the uppermost unit package 42c as a cover is made from a glass-epoxy resin similarly to the base substrates 43a, 43b and 43c, and bonded with the substrate adhesive 46c.

After the three unit packages 42a, 42b and 42c are laminated, through holes 48a and 48b are formed to penetrate the three-layer laminated body at both sides of the semiconductor chips 44a, 44b and 44c. Copper plating layers 49a and 49b are formed on the inside walls of the through holes 48a and 48b.

When a heat-cycle test is performed on the semiconductor package 41 thus formed by laminating the unit packages 42a, 42b and 42c as shown in FIG. 4, the package 41 would be warped. This warp would cause detachment of each flip-chip connection portions between the base substrates 43a, 43b and 43c and the semiconductor chips 44a, 44b and 44c. This causes the adhesion of the laminated parts in the laminated body to be less reliable. In addition, when the semi-conductor chips 44a, 44b and 44c are in thin film forms, the semiconductor laminated package 41 is warped repeatedly in the heat-cycle test, which in some cases causes cracks in one or more of the semiconductor chips 44a to 44c.

Considering causes of the above-mentioned prior art problems, it is evident that, after the semi-conductor chips 44a to 44c are flip-chip connected to the base substrates 43a to 43c, the warp is caused by stress occurred by a difference of thermal expansion amount between chip adhesives 45a to 45c, which are used as seal resin films for sealing lower sides of the semiconductor chips 44a to 44c, and the substrate adhesives 46a to 46c, which are used as seal resin films for sealing upper sides of the semiconductor chips 44a to 44c when the unit packages 42a to 42c are laminated. Further, it is evident that the warp is also caused by stress occurred by a difference of their elasticity modulus that varies with the temperature.

BRIEF SUMMARY OF THE INVENTION

A semiconductor laminate module according to one aspect of the present invention comprises a plurality of unit packages in which semiconductor chips are bonded to base substrates with a first adhesive; a second adhesive for forming a laminated body by bonding the plurality of unit packages to each other; a third adhesive formed to cover upper surfaces of the semiconductor chips and having substantially the same thermal expansion coefficient as that of the first adhesive; and an uppermost substrate bonded to an uppermost unit package with the second adhesive.

BRIEF DESCRIPTION OF THE SEVERAL VIEWS OF THE DRAWING

FIG. 1 is a sectional view showing a semiconductor laminated module according to a first embodiment of the present invention.

FIG. 2 is a sectional view showing a constitution of a unit package, which is a component of the first embodiment semiconductor laminated module shown in FIG. 1.

DETAILED DESCRIPTION OF THE INVENTION

Figure 3:
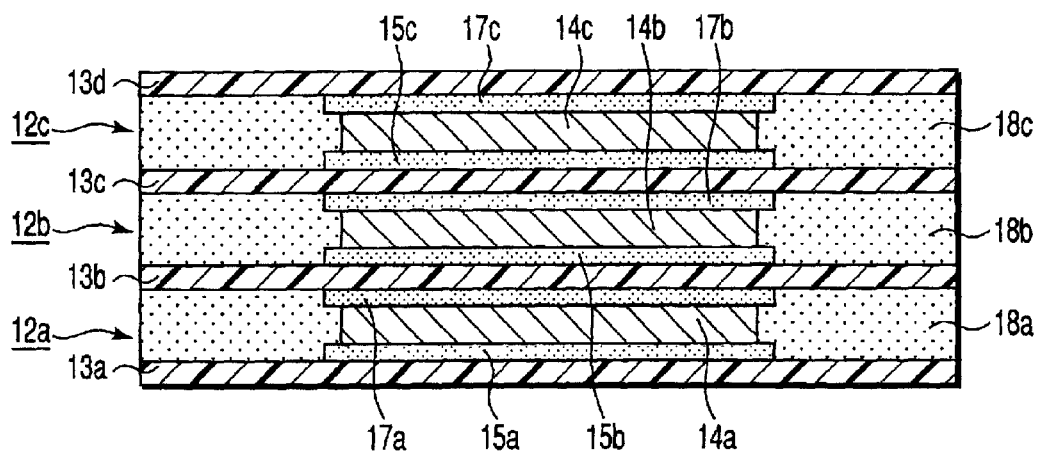
FIG. 3 is a sectional view showing a laminated body constituted by laminating three unit packages each having the constitution of FIG. 2 in a manufacturing process of the semiconductor laminated module shown in FIG. 1.
Figure 4:
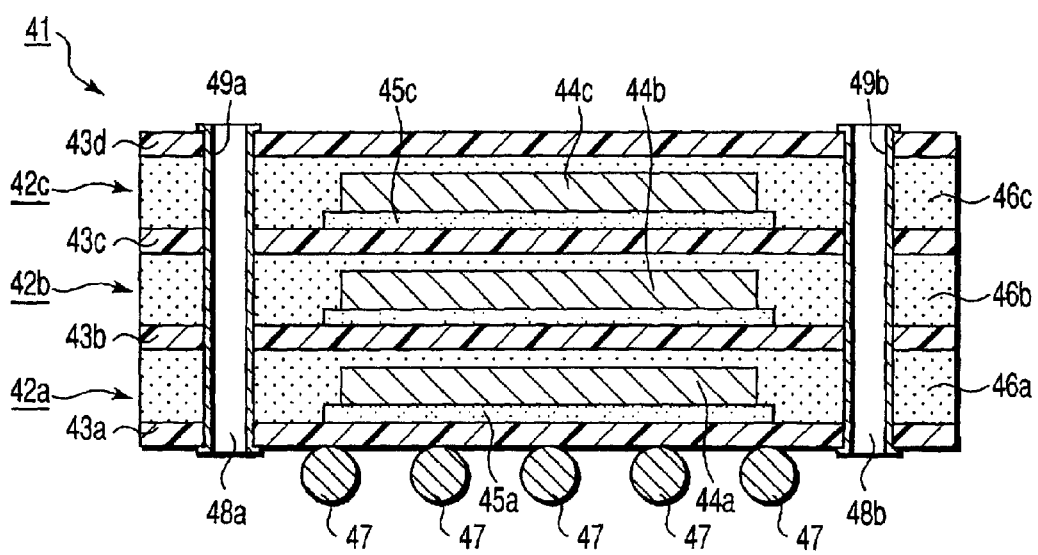
FIG. 4 is a sectional view showing an example of a constitution of a prior art semiconductor laminated module.

One embodiment of the present invention will be described with reference to FIG. 1 to FIG. 3.

FIG. 1 shows a completed semiconductor laminated module 11 according to the first embodiment of the present invention. The semiconductor laminated module 11 is constituted by laminating three unit packages 12a, 12b and 12c in a vertical direction. The module 11 is formed as a square thin plate of 12 mm×18 mm to have an overall thickness of about 780 μm.

For example, as shown in FIG. 2, the lowermost unit package 12a includes a base substrate 13a having a thickness of 60 μm made of a glass-epoxy resin. On an upper surface of the base substrate 13a, a plurality of wirings 23a-1, 23a-2, 23a-3 and 23a-4 formed by, for example, patterning copper foil, are formed having a thickness of about 100 μm, for example. Any metal foil may be used for the copper foil.

On the base substrate 13a, for example, a square semiconductor chip 14a of 10 mm×13 mm is flip-chip connected.

On a lower surface of the semiconductor chip 14a, a plurality of solder bumps acting as input/output terminals 14ab-1, 14ab-2, 14ab-3 and 14ab-4 are formed. These input/output terminals 14ab-1, 14ab-2, 14ab-3 and 14ab-4 are selectively electrically connected to the wirings 23a-1, 23a-2, 23a-3 and 23a-4 formed on the upper surface of the base substrate 13a.

The sides of the input/output terminals 14ab-1, 14ab-2, 14ab-3 and 14ab-4 are covered with a first chip adhesive 15a such as a film-like thermosetting resin adhesive made of an epoxy-based resin having a thickness of about 40 μm. for example. In this state, the semiconductor chip 14a is bonded to the base substrate 13a.

On a lower surface of the base substrate 13a, copper wirings 24a-1, 24a-2, 24a-3, 24a-4 and 24a-5 are provided in the same way as the wirings 23a-1, 23a-2, 23a-3 and 23a-4, so that the copper wirings 24a-1, 24a-2, 24a-3, 24a-4 and 24a-5 may be connected to the solder bumps 21a to 21e shown in FIG. 1, respectively.

As shown in FIG. 1, an upper surface of the semiconductor chip 14a is covered with a second chip adhesive 17a being a film-like thermosetting resin adhesive made of an epoxy-based resin having the same composition and thickness as those of the first chip adhesive 15a. Then, a substrate adhesive 18a such as a Prepreg composed of a thermosetting resin adhesive of an epoxy-based resin is deposited in a way to cover the whole of the semiconductor chip 14a and the first and second chip adhesives 15a and 17a, with an upper surface of the second chip adhesive 17a exposed from the substrate adhesive 18a. In this way, the unit package 12a is completed. The chip adhesives 15a and 17a may be formed of the same material, or may be formed of any material, provided that they have substantially the same thermal expansion coefficient.

The other unit packages 12b and 12c are constituted in the same way as the unit package 12a. Although not shown in FIG. 1, the base substrates 13b and 13c may have the same or similar wirings formed on their upper and lower surfaces as the wirings 23a-1, 23a-2, 23a-3 and 23a-4 and the wirings 24a-1, 24a-2, 24a-3, 24a-4 and 24a-5 in the same or similar way as the base substrate 13a in FIG. 2. If this manufacturing scheme is used, a merit of mass production can be realized for the base substrates 13a to 13c. This is effective for reducing manufacture costs of the semiconductor laminated module.

Then, to an upper surface of the unit package 12c, an uppermost substrate 13d made of a glass-epoxy resin having a thickness of 60 μm is bonded using the substrate adhesive 18c such as a Prepreg composed of a thermosetting resin adhesive of an epoxy-based resin, for example.

FIG. 3 shows a three-package laminated body constitution manufactured in such a way.

Furthermore, in the laminated body in which the unit packages 12a to 12c are three-dimensionally laminated, semiconductor chips 14a to 14c are laminated in an aligned fashion in such a manner that the semiconductor chips 14a to 14c are positioned at corresponding positions within the unit packages 12a to 12c. In predetermined positions of the unit packages 12a to 12c and of the base substrate 13d which are adjacent to the semiconductor chips 14a to 14c, as shown in FIG. 1, a plurality of through holes are formed through the laminated body. In FIG. 1, only two through holes 19a and 19b penetrating the laminated body are shown. Inside the through holes 19a and 19b, copper plating layers 20a and 20b are provided. As shown in FIG. 2, these copper plating layers 20a and 20b are selectively connected to predetermined wirings among the wirings 23a-1, 23a-2, 23a-3 and 23a-4 and the wirings 24a-1, 24a-2, 24a-3, 24a-4 and 24a-5 that are formed on the upper and lower surfaces of the base substrate 13a respectively. For example, in FIG. 2, one copper plating layer 20a is connected to an upper wiring 23a-1 that is connected to the semiconductor chip 14a via the bump 14ab-1 and the lower wiring 24a-1. The other copper plating layer 20b is connected to the upper wiring 23a-4, which is connected to the semiconductor chip 14a via the bump 14ab-4, and the lower wiring 24a-6. Though not shown in the figure, other unit packages 12b and 12c are also connected in the similar way.

Furthermore, to the lower wirings 24a-1, 24a-2, 24a-3, 24a-4 and 24a-5 that are provided on the lower surface of the base substrate 13a of the lowermost unit package 12a, solder balls 21a, 21b, 21c, 21d and 21e are stuck, as shown in FIG. 1. The semiconductor laminated module 11 is thus completed.

The manufacture processes of the semiconductor laminated module 11 having such a constitution as above described will be performed in the following steps.

First, as shown in FIG. 2, the semiconductor chip 14a is flip-chip connected to a predetermined position on the lowermost base substrate 13a with the first film-like chip adhesive 15a provided in between, whereby the lowermost unit package 12 is constituted. Then, the second film-like chip adhesive 17a is put on the semiconductor chip 14a, and the substrate adhesive 18a is applied to the whole upper surfaces of the base substrate 13a and the semiconductor chip 14a.

Next, as in the lowermost unit package 12a, the semiconductor chip 14b is flip-flop connected to a predetermined position on the second base substrate 13b with the first film-like chip adhesive 15b provided in between. The second or middle unit package 12b thus constituted is laminated on the second chip adhesive 17a and the substrate adhesive 18a that are provided to cover the lowermost semiconductor chip 14a.

Then, the second film-like chip adhesive 17b is put on the semiconductor chip 14b, and the substrate adhesive 18b is applied to the whole upper surfaces of the base substrate 13b and the semiconductor chip 14b.

Next, as in the lowermost unit package 12a, the semiconductor chip 14c is flip-flop connected to a predetermined position on the uppermost substrate 13c with the first film-like chip adhesive 15c provided in between. The uppermost unit package 12c thus constituted is laminated on the second chip adhesive 17b and the substrate adhesive 18b that are provided to cover the semiconductor chip 14b of the middle unit package 12b.

Then, the second film-like chip adhesive 17c is put on the semiconductor chip 14c. The substrate adhesive 18c is applied to the whole upper surfaces of the base substrate 13c to cover the side surfaces of the semiconductor chip 14c.

Finally, the uppermost substrate 13d is put on the second chip adhesive 17c and the substrate adhesive 18c, thereby forming the laminated body shown in FIG. 3.

After the laminated body shown in FIG. 3 formed by sequentially laminating the unit packages 12a to 12c is manufactured, it is heated, for example, at a predetermined temperature of 180° C., and at the same time is given a pressure of, for example, 20 kg/cm for 70 minutes in the vertical direction between the lowermost base substrate 13a and the uppermost substrate 13d. During the heat and pressure applying step, the substrate adhesives 18a to 18c are flown into spaces formed between each two adjacent base substrates to fill the spaces. Then, the first, second and third adhesives are hardened in a room temperature, for example.

In this way, the unit packages 12a to 12c shown in FIG. 3 form a three-dimensional laminated body.

After this, the through holes 19a and 19b are formed to penetrate through predetermined positions of the laminated body. The insides of the through holes 19a and 19b are covered by the copper plating layers 20a and 20b. Furthermore, to the lower wirings 24a-1, 24a-2, 24a-3, 24a-4 and 24a-5 that are provided on the lower surface of the base substrate 13a, the solder balls 21a to 21e are stuck and formed respectively as shown in FIG. 1.

After the semiconductor laminated module 11 constituted as above is heated and pressured, its warp is checked. The warp is much reduced and there are not any cracks found in the flip-chip connection portions between the base substrates 13a to 13c and the semiconductor chips 14a to 14c, and the adhesion of the laminated portions is still good. In the heat cycle test, as the semiconductor chips 14a to 14c are put between the first and second chip adhesives 15a to 15c and 17a to 17c that have an equal composition and thickness, and that have equal or almost equal thermal expansion coefficient, it is possible to reduce stress occurring in the semiconductor chips 14a to 14c due to the temperature change of the laminated body. Further, there is no crack caused in the semiconductor chips 14a to 14c themselves. Thus, the fear of cracks to be caused is reduced. Therefore, even when the semiconductor chips 14a to 14c are thinly formed, the semiconductor laminated module 11 can be still reliable. It is best for the first and second chip adhesives 15a to 15c and 17a to 17c to employ the same adhesive material. However, different adhesive materials may be used as the first and second adhesives if they have substantially the same or similar thermal expansion coefficient. In addition to the same or similar thermal expansion coefficient, if adhesive materials, which have substantially the same or similar change rate of elasticity modulus dependent on temperature change, are used, there are no differences in the stress change caused by elasticity modulus change according to the temperature change. This never causes a warp of the semiconductor laminated module and no stress change occurs.

According to the above-mentioned embodiment, the semiconductor chips 14a to 14c have a thickness of 100 μm. The same advantage can be obtained as above in those that have a thickness of 200 μm or less at which cracks of the semiconductor chips may occur.

As apparent from the above description, according to the present invention, warping that occur when unit packages are three-dimensionally laminated is reduced. Detachment of semiconductor chips that are flip-chip connected to the base substrates is reduced. The adhesion of the laminated parts is maintained unchanged. There is no fear of cracks to be caused even in thin semiconductor chips. It is thereby possible to provide a semiconductor laminated module with improved reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor laminated module comprising:
    a plurality of unit packages in each of which a semiconductor chip is bonded to a base substrate with a first adhesive;
    a second adhesive to form a laminated body by bonding said plurality of unit packages to each other;
    a third adhesive formed to cover each upper surface of said semiconductor chips and having substantially the same thermal expansion coefficient as that of said first adhesive; and
    an uppermost substrate bonded to uppermost one of said unit packages with said second adhesive,
    wherein said base substrate in each of the unit packages has predetermined wiring patterns formed on both upper and lower surfaces,
    a plurality of base substrates in said plurality of unit packages have the same or similar wiring patterns on upper surfaces and the same or similar wiring patterns on lower surfaces,
    said laminated body includes at least one through hole formed adjacent to said semiconductor chips and a conductive film formed on an inner wall of said through hole, and
    each of said plurality of unit packages is selectively connected to said conductive film via said wiring patterns formed on the base substrates.

2. The semiconductor laminated module according to claim 1, wherein said first adhesive and said third adhesive are made of the same adhesive material.

3. The semiconductor laminated module according to claim 1, wherein said first adhesive and said third adhesive have substantially the same thickness.

4. The semiconductor laminated module according to claim 1, wherein said semiconductor chip has a thickness of 200 μm or less.

5. The semiconductor laminated module according to claim 1, wherein said semiconductor chips are flip-chip connected to said base substrates, respectively.

6. The semiconductor laminated module according to claim 1, wherein said first adhesive is formed of a thermosetting resin.

7. A semiconductor laminated module according to claim 1,
    wherein said plurality of unit packages are stacked to form the semiconductor laminated module in which an upper surface of the second adhesive and the upper surface of the third adhesive of one unit package are bonded to a lower surface of the base substrate in another unit package adjacent to the one unit package.

8. A semiconductor laminated module according to claim 7, further comprising an uppermost substrate bonded to the third adhesive and the upper surface of the second adhesive provided in an uppermost one of said plurality of unit packages.

* * * * *